United States Patent
Ben-Yishay et al.

(10) Patent No.: US 9,548,704 B1
(45) Date of Patent: Jan. 17, 2017

(54) BALUN BASED PHASE INVERTER USING REPLICA LOAD

(71) Applicant: International Business Machines Corporation, Armonk, NY (US)

(72) Inventors: Roee Ben-Yishay, Haifa (IL); Oded Katz, Ganei-Tikva (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/984,042

(22) Filed: Dec. 30, 2015

(51) Int. Cl.
   H03F 1/56 (2006.01)
   H03F 3/19 (2006.01)
   H03F 3/217 (2006.01)

(52) U.S. Cl.
   CPC ...... *H03F 1/56* (2013.01); *H03F 3/19* (2013.01); *H03F 3/217* (2013.01); *H03F 2200/555* (2013.01)

(58) Field of Classification Search
   USPC .. 330/301, 251, 124 R, 295, 84, 286, 53–54
   See application file for complete search history.

(56) References Cited

U.S. PATENT DOCUMENTS

| 7,538,618 B2 | 5/2009 | Park et al. |
| 2016/0079985 A1* | 3/2016 | Zhu ............... H03K 23/544 370/329 |

* cited by examiner

*Primary Examiner* — Hieu Nguyen
(74) *Attorney, Agent, or Firm* — Cantor Colburn LLP; David Quinn

(57) ABSTRACT

Aspects of the present invention include a circuit that includes an input balun circuit responsive to an input signal, the input balun circuit being configured to provide two output signals that are out of phase with each other. The circuit further includes an actual switched amplification stage configured to direct one of the balun output signals to a phase inverter output, and a replica switched amplification stage connected in parallel with the actual switched amplification stage, wherein the actual switched amplification stage and the replica switched amplification stage are responsive to the two output signals from the input balun circuit to direct one of the balun output signals to the phase inverter output, and wherein the actual switched amplification stage and the replica switched amplification stage are configured to have a constant load impedance for both switch states that matches an impedance of the input balun circuit.

18 Claims, 1 Drawing Sheet

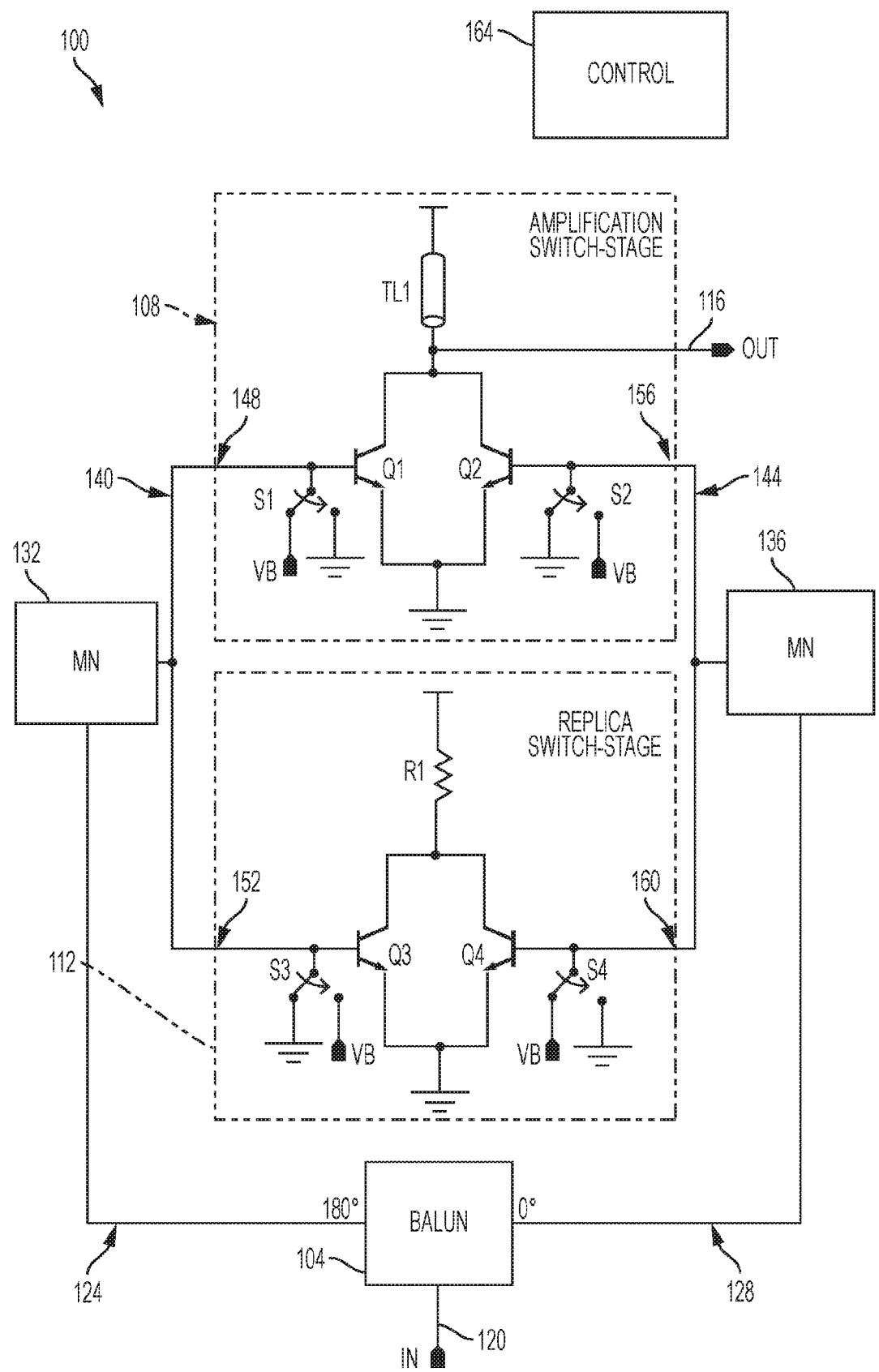

BALUN BASED PHASE INVERTER USING REPLICA LOAD

BACKGROUND

The present invention relates to a phase inverter circuit, and more specifically, to a phase inverter circuit having an input balun circuit and having a replica switched amplification stage to load the input balun circuit in parallel with the actual switched amplification stage of the phase inverter.

A phase inverter is a circuit that includes an input terminal, an output terminal and one bit control terminal. Typically, the input and output signals are single ended signals. A phase inverter creates a 180 degrees phase difference of the output signals when the control bit is being toggled between the "ON" and "OFF" states.

A "balun" or "balanced to unbalanced" circuit is a common electrical or electronic circuit that comes in many different types or forms. A balun may be used as part of a phase inverter circuit that converts a single ended input signal into a differential output signal (i.e., phase inverted or 180 degrees out of phase).

The phase inverter may include a switched amplification stage or circuit at the output of the phase inverter. Only one of the two outputs of the balun circuit may be directed to the phase inverter output, thus controlling the desired phase of the phase inverter output.

As the phase inverter is toggled between its two output states, it is important that the differential load or impedance seen by the input balun circuit always remain approximately the same; for example, one hundred ohms (100Ω). If the balun is not properly loaded as such by the remainder of the phase inverter circuit, then the phase difference between the two outputs of the phase inverter may not be 180 degrees out of phase and, thus, the output of the phase inverter may not accurately invert the phase. Also, the phase inverter input matching may degrade.

Consider an example where a phase inverter circuit comprises only an input balun circuit and a switched amplification stage at the phase inverter output. When one side of the phase inverter circuit output is switched "ON" for example, that side of the phase inverter circuit can easily match the impedance seen by the input balun circuit to 50Ω. However, the other output side of the phase inverter circuit is switched "OFF" and exhibits a relatively high impedance value as seen by the input balun circuit. As a result, in this exemplary situation the input balun circuit is not properly loaded at all times with a 100Ω differential impedance.

A balun circuit may comprise transistors (an "active" balun circuit) or the balun circuit may comprise inductors and capacitors (a "passive" lumped balun circuit). Also, baluns may comprise transmission lines in a Marchand balun structure (a "passive" Marchand balun circuit). Also, baluns may comprise other types of electrical components (e.g., transformers).

Baluns find usage in a wide range of devices, including high frequency (e.g., 60 GHz V-Band) phased array devices and transceivers for use in, e.g., radar applications. Baluns are oftentimes embodied in integrated circuits ("ICs") or may comprise various discrete electrical components mounted on a printed circuit board. Regardless, it is desired that the phase inverter circuit that includes the input balun circuit be implemented in a relatively compact and simple manner.

SUMMARY

According to an embodiment of the present invention, a circuit includes an input balun circuit responsive to an input signal, the input balun circuit being configured to provide two output signals that are out of phase with each other. The circuit further includes an actual switched amplification stage configured to direct one of the balun output signals to a phase inverter output, and a replica switched amplification stage connected in parallel with the actual switched amplification stage, wherein the actual switched amplification stage and the replica switched amplification stage are responsive to the two output signals from the input balun circuit to direct one of the balun output signals to the phase inverter output, and wherein the actual switched amplification stage and the replica switched amplification stage are configured to have constant a load impedance for both switch states that matches an impedance of the input balun circuit.

According to another embodiment of the present invention, a method includes providing a circuit includes an input balun circuit responsive to an input signal, the input balun circuit being configured to provide two output signals that are out of phase with each other. The circuit further includes providing an actual switched amplification stage configured to direct one of the balun output signals to a phase inverter output, and providing a replica switched amplification stage connected in parallel with the actual switched amplification stage, wherein the actual switched amplification stage and the replica switched amplification stage are responsive to the two output signals from the input balun circuit to direct one of the balun output signals to the phase inverter output, and wherein the actual switched amplification stage and the replica switched amplification stage are configured to have a constant load impedance for both switch states that matches an impedance of the input balun circuit.

According to yet another embodiment of the present invention, a phase inverter circuit includes an input balun circuit responsive to an input signal, the input balun circuit being configured to provide two output signals that are out of phase with each other. The phase inverter circuit further includes an actual switched amplification stage configured to direct one of the balun output signals to a phase inverter output, and a replica switched amplification stage connected in parallel with the actual switched amplification stage. The phase inverter circuit also includes two matching networks, a first matching network connected between a first one of the two output signals from the input balun circuit and a first input to both the actual switched amplification stage and the replica switched amplification stage, a second matching network connected between a second one of the two output signals from the input balun circuit and a second input to both the actual switched amplification stage and the replica switched amplification stage. In the phase inverter circuit, the actual switched amplification stage and the replica switched amplification stage are responsive to the two output signals from the input balun circuit to direct one of the balun output signals to the phase inverter output, and wherein the actual switched amplification stage and the replica switched amplification stage are configured to have a constant load impedance for both switch states that matches an impedance of the input balun circuit.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1 is a schematic diagram of a phase inverter circuit having an input balun circuit, an actual switched amplification stage, and a replica switched amplification stage in accordance with an embodiment of the present invention.

DETAILED DESCRIPTION

Referring now to the sole FIGURE, FIG. 1, a phase inverter circuit 100 includes an input balun circuit 104, an actual switched amplification stage (or circuit) 108, and a replica switched amplification stage 112. The replica switched amplification stage 112 loads the input balun circuit 104 in parallel with the actual switched amplification stage 108 of the phase inverter 100. That is, the actual switched amplification stage 108 and the replica switched amplification stage 112 are connected in parallel at the output of the input balun circuit 104. This way, when the phase inverter 100 is "toggled" or switched, one of balun output signals (for example 124 or the 180° balun output) is being directed to the output signal line 116 instead of the other balun output signal (for example 128 or the 0° balun output). Thus, the output of the phase inverter change by 180 degrees to the opposite state, but also there is no change in the load placed on (i.e., the impedance seen by) the balun circuit 104.

The two output states of the phase inverter output signal 116 may be represented by, for example, sine wave signal, or an analog modulated signal, or digital signal having minimum and maximum voltage values such as, e.g., zero (0) volts and +5 volts, or binary "1" and "0". The phase inverter output signal 116 may be utilized by one or more circuits or stages (not shown) located or connected "downstream" of the phase inverter 100, depending upon the function of the overall electronic device (e.g., a transceiver) that the phase inverter 100 is a part of.

In embodiments of the phase inverter circuit 100 shown in FIG. 1, the input balun circuit 104 may comprise a passive balun circuit such as, for example, the known Marchand or Lumped Element types of balun circuits. In other embodiments, the balun circuit 104 may comprise an active balun circuit that comprises switches such as transistors. Regardless, the balun circuit 104 may be responsive to a single-ended input signal on a line 120 from a circuit or device (not shown) located or connected "upstream" of the input balun circuit 104. The balun circuit 104 supplies two output signals on the lines 124, 128. The two signals 124, 128 may each comprise, for example, a sine wave signal, wherein the two sine wave signals are 180 degrees out of phase with respect to one another.

Each or the two balun output signals 124, 128 may be provided to a corresponding matching network ("MN") 132, 136. In embodiments of the present invention, each matching network 132, 136 may comprise a passive network that includes "passive" electrical or electronic components such as resistors, capacitors, inductors, transmission lines, etc. (as opposed to "active" components such as transistors). The main purpose of the matching networks 132, 136, in addition the replica switched amplification stage 112 being connected in parallel with the actual switched amplification stage 108, is to "match" the load impedance provided by the parallel combination of the actual switched amplification stage 108 and the replica switched amplification stage 112 to the output signals 124, 128 of the balun circuit 104. As mentioned hereinbefore, a typical value for the impedance at the balun circuit outputs 124, 128 is 100Ω. Thus, for proper signal transfer of the balun output signals 124, 128 to the parallel combination of the replica switched amplification stage 112 and the actual switched amplification stage 108, the impedance "seen" by (or the load presented to) the balun circuit outputs 124, 128 should also be 100Ω.

In embodiments of the present invention, each matching network 132, 136 connected to with a line 140, 144, respectively, to an input of the actual switched amplification switch stage 108 and an input of the replica switched amplification switch stage 112. More specifically, the output terminal 140 from the matching network 132 is connected with both one input 148 of the actual switched amplification stage 108 and one input 152 of the replica amplification switch stage 112. Further, the output terminal 144 from the matching network 136 is connected with both another input 156 of the actual switched amplification stage 108 and another input 160 of the replica switched amplification stage 112. Each input 148, 152, 156, 160 may be connected to a base terminal of an NPN-type transistor Q1, Q2, Q3, Q4. Further, as shown in FIG. 1, each input 148, 152, 156, 160 may also be connected to a control arm of a switch S1, S2, S3, S4. The control arm of each switch may be controlled so as to open and close each switch at the appropriate times. Such control of the switches S1-S4 may be carried out by a control device 164 (e.g., a processor), that may, for example, be a part of the overall device (e.g., a transceiver) that the phase inverter 100 is a part of.

In operation, when it is desired that the 180° signal 124 from the balun 104 be passed to the output 116 of the phase inverter 100, the switches S1-S4 are controlled by the control device 164 such that transistor Q1 is "ON" (i.e., by putting switch S1 in a state so that the base terminal of transistor Q1 is connected to a transistor bias voltage VB of e.g., 0.7 volts) and such that transistor Q2 is "OFF" (i.e., by putting switch Q2 in a state so that the base terminal of transistor Q2 is connected to a ground or zero volts). At the same time, transistor Q3 is switched "OFF" and transistor Q4 is switched "ON."

In the alternative, in operation when it is desired that the 0° signal 128 from the balun 104 be passed to the output 116 of the phase inverter 100, the switches S1-S4 are controlled by the control device 164 such that transistor Q1 is "OFF" and transistor Q2 is "ON." At the same time, transistor Q3 is switched "ON" and transistor Q4 is switched "OFF."

Thus, as can be seen from the foregoing, the output signal 116 of the phase inverter 100 is switched between its two output states that are 180° out of phase or apart from each other, by controlling the switches S1-S4 between their two states (passing either bias voltage VB or ground to the transistors Q1-Q4 base), which correspondingly controls the transistors Q1-Q4 between their "ON" and "OFF" states, to thereby pass the output signals 124, 128 from the balun circuit 104 at the appropriate time to the output 116 of the phase inverter 100.

In exemplary embodiments, both the actual amplification switch stage 108 and the replica amplification switch stage 112 may comprise NPN-type transistors. However, that is purely exemplary. Each stage 108, 112 may comprise PNP-type transistors, or other types of amplification stages configuration such as common-base where the inputs 148, 152, 156, 160 may be connected to a emitter terminal of an NPN-type transistor Q1, Q2, Q3, Q4 and the output 116 connected to the collector terminal of an NPN-type transistor Q1, Q2, Q3, Q4, or CMOS transistors such as NMOS or PMOS transistors, or other types of switching devices. Also, each stage 108, 112 may comprise devices other than those described hereinabove and illustrated in FIG. 1.

Embodiments of the present invention implement a phase inverter circuit 100 for a single-ended input signal 120 to the balun 104 using a replica switched amplification stage 112 to load the input balun circuit 104 in parallel with the actual switched amplification stage 108. In this way, when the phase inverter circuit 100 toggles or changes the state of its output signal 116, that is no change in the load seen by the balun circuit 104.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit comprising:
  an input balun circuit responsive to an input signal, the input balun circuit being configured to provide two output signals that are out of phase with each other;
  an actual switched amplification stage configured to direct one of the balun output signals to the phase inverter output; and
  a replica switched amplification stage connected in parallel with the actual switched amplification stage;
  wherein the actual switched amplification stage and the replica switched amplification stage are responsive to the two output signals from the input balun circuit to direct one of the balun output signals to the phase inverter output, and wherein the actual switched amplification stage and the replica switched amplification stage are configured to have a constant load impedance for both switch states that matches an impedance of the input balun circuit, and
  wherein the actual switched amplification stage and the replica switched amplification stage each comprises an amplification circuit of transistors and switches, and wherein the circuit further comprises a control device that controls a state of the transistors and the switches during operation of the circuit.

2. The circuit of claim 1 wherein the circuit comprises a phase inverter circuit.

3. The circuit of claim 1 further comprising two matching networks, a first matching network connected between a first one of the two output signals from the input balun circuit and a first input to both the actual switched amplification stage and the replica switched amplification stage, a second matching network connected between a second one of the two output signals from the input balun circuit and a second input to both the actual switched amplification stage and the replica switched amplification stage.

4. The circuit of claim 3 wherein each of the two matching networks is configured to match the load impedance of both the actual switched amplification stage and the replica switched amplification stage to the impedance of the input balun circuit.

5. The circuit of claim 1 wherein the input balun circuit comprises one of an active balun circuit and a passive balun circuit.

6. The circuit of claim 1 wherein the input balun circuit comprises a passive balun circuit from a group comprising a Marchand type balun circuit and a Lumped Element type balun circuit.

7. A method comprising:
  providing an input balun circuit responsive to an input signal, the input balun circuit being configured to provide two output signals that are out of phase with each other;
  providing an actual switched amplification stage configured to direct one of the balun output signals to the a phase inverter output; and
  providing a replica switched amplification stage connected in parallel with the actual switched amplification stage;
  wherein the actual switched amplification stage and the replica switched amplification stage are responsive to the two output signals from the input balun circuit to direct one of balun output signals to the phase inverter output, and wherein the actual switched amplification stage and the replica switched amplification stage are configured to have a constant load impedance for both switch states that matches an impedance of the input balun circuit, and
  wherein the actual switched amplification stage and the replica switched amplification stage each comprises an amplification circuit of transistors and switches, and wherein the method further comprises providing a control device that controls a state of the transistors and the switches during operation of the circuit.

8. The method of claim 7 wherein the circuit comprises a phase inverter circuit.

9. The method of claim 7 further comprising providing two matching networks, a first matching network connected between a first one of the two output signals from the input balun circuit and a first input to both the actual switched amplification stage and the replica switched amplification stage, a second matching network connected between a second one of the two output signals from the input balun circuit and a second input to both the actual switched amplification stage and the replica switched amplification stage.

10. The method of claim 9 wherein each of the two matching networks is configured to match the load impedance of both the actual switched amplification stage and the replica switched amplification stage to the impedance of the input balun circuit.

11. The method of claim 7 wherein the input balun circuit comprises one of an active balun circuit and a passive balun circuit.

12. The method of claim 7 wherein the input balun circuit comprises a passive balun circuit from a group comprising a Marchand type balun circuit and a Lumped Element type balun circuit.

13. A phase inverter circuit comprising:
- an input balun circuit responsive to an input signal, the input balun circuit being configured to provide two output signals that are out of phase with each other;
- an actual switched amplification stage configured to direct one of the balun output signals to the a phase inverter output;
- a replica switched amplification stage connected in parallel with the actual switched amplification stage; and
- two matching networks, a first matching network connected between a first one of the two output signals from the input balun circuit and a first input to both the actual switched amplification stage and the replica switched amplification stage, a second matching network connected between a second one of the two output signals from the input balun circuit and a second input to both the actual switched amplification stage and the replica switched amplification stage;
- wherein the actual switched amplification stage and the replica switched amplification stage are responsive to the two output signals from the input balun circuit to direct one of the balun output signals to the phase inverter output, and wherein the actual switched amplification stage and the replica switched amplification stage are configured to have a constant load impedance for both switch states that matches an impedance of the input balun circuit.

14. The phase inverter circuit of claim 13 wherein each of the two matching networks is configured to match the load impedance of both the actual switched amplification stage and the replica switched amplification stage to the impedance of the input balun circuit.

15. The phase inverter circuit of claim 13 wherein the input balun circuit comprises one of an active balun circuit and a passive balun circuit.

16. The phase inverter circuit of claim 13 wherein the input balun circuit comprises a passive balun circuit from a group comprising a Marchand type balun circuit and a Lumped Element type balun circuit.

17. The phase inverter circuit of claim 13 wherein the actual switched amplification stage and the replica switched amplification stage each comprises an amplification circuit of transistors and switches.

18. The phase inverter circuit of claim 17 wherein the phase inverter circuit further comprises a control device that controls a state of the transistors and the switches during operation of the phase inverter circuit.

\* \* \* \* \*